United States Patent
Hsu et al.

[19]

[11] Patent Number: 6,100,154
[45] Date of Patent: Aug. 8, 2000

[54] USING LPCVD SILICON NITRIDE CAP AS A BARRIER TO REDUCE RESISTANCE VARIATIONS FROM HYDROGEN INTRUSION OF HIGH-VALUE POLYSILICON RESISTOR

[75] Inventors: Yung-Lung Hsu; Shun-Liang Hsu, both of Hsin-Chu, Taiwan

[73] Assignee: Taiwan Semiconductor Manufacturing Company, Hsin-Chu, Taiwan

[21] Appl. No.: 09/234,096

[22] Filed: Jan. 19, 1999

[51] Int. Cl.$^7$ ................................................ H01L 21/8244
[52] U.S. Cl. ............................................ 438/385; 438/659
[58] Field of Search ................................. 438/238, 382, 438/383, 384, 385, 659

[56] References Cited

U.S. PATENT DOCUMENTS

| | | | |
|---|---|---|---|
| 5,185,285 | 2/1993 | Hasaka ..................................... | 438/385 |
| 5,236,857 | 8/1993 | Eklund et al. ............................. | 437/47 |
| 5,397,729 | 3/1995 | Kayanuma et al. ...................... | 438/385 |
| 5,438,014 | 8/1995 | Hashimoto ............................... | 438/385 |
| 5,465,005 | 11/1995 | Eklund et al. ........................... | 257/538 |
| 5,500,553 | 3/1996 | Ikegami .................................... | 257/538 |
| 5,530,418 | 6/1996 | Hsu et al. ................................. | 338/307 |
| 5,656,524 | 8/1997 | Eklund et al. ........................... | 438/238 |
| 5,728,615 | 3/1998 | Cheng et al. ............................ | 438/238 |

OTHER PUBLICATIONS

Nakabayashi et al., "Influence of Hydrogen on Electrical Characteristics of Poly–Si Resistor" Japanese Journal of Applied Physics, C.1982, pp. 3734–3738.
Wolf et al., "Silicon Processing for the VLSI Era," vol. 1, Lattice Press, p. 222, c. 1986.

*Primary Examiner*—Chandra Chaudhari
*Attorney, Agent, or Firm*—George O. Saile; Stephen B. Ackerman; Rosemary L. S. Pike

[57] ABSTRACT

A new method of forming a polysilicon resistor having reduced resistance variations by using an LPCVD silicon nitride cap over the polysilicon resistor is described. A field oxide layer is provided overlying a semiconductor substrate. A polysilicon layer is deposited overlying the field oxide layer and etched away where it is not covered by a mask to form a polysilicon resistor. The polysilicon resistor is oxidized to form an oxide layer on all surfaces of the polysilicon resistor. A silicon nitride barrier layer is deposited overlying the oxide layer. An interlevel dielectric layer is dpeosited overlying the silicon nitride barrier layer. Contact openings are etched through the interlevel dielectric layer, silicon nitride barrier layer, and oxide layer to the polysilicon resistor. The contact openings are filled with a metal layer which is patterned. The patterned metal layer is covered with a passivation layer wherein the passivation layer contains hydrogen atoms and wherein the silicon nitride barrier layer prevents the hydrogen atoms from penetrating the polysilicon resistor.

20 Claims, 7 Drawing Sheets

USING LPCVD SILICON NITRIDE CAP AS A BARRIER TO REDUCE RESISTANCE VARIATIONS FROM HYDROGEN INTRUSION OF HIGH-VALUE POLYSILICON RESISTOR

BACKGROUND OF THE INVENTION (1) Field of the Invention

The invention relates to a method of forming polysilicon resistors in the fabrication of integrated circuits, and more particularly, to a method of forming polysilicon resistors with reduced resistance variation in the manufacture of integrated circuits.

(2) Description of the Prior Art

It is common in the art to employ resistors within an integrated circuit which will provide an electrical load which assures proper operation of the circuit under electrical current and voltage parameters to which the circuit was designed. One of the several methods of forming resistors is to use undoped or lightly doped polysilicon, a well-known highly resistive material. An unfortunate characteristic of polysilicon resistors is their ability to absorb hydrogen to which the resistors are exposed during semiconductor processing. The hydrogen is absorbed by carrier trapping states at grain boundaries, rendering the traps electrically inactive. This results in resistance reduction and fluctuation of the resistors. The paper, "Influence of Hydrogen on Electrical Characteristics of Poly-Si Resistor" by Nakabayashi et al, *Japanese Journal of Applied Physics,* c. 1982, pp. 3734–3738, discusses this topic. The source of hydrogen atoms may be a silicon nitride passivation layer deposited by plasma-enhanced chemical vapor deposition (PECVD); that is, silane ($SiH_4$)+$N_2$. In *Silicon Processing for the VLSI ERA,* Vol. 1, by Wolf and Tauber, p. 222, it is revealed that silicon nitride can serve to block the diffusion of atomic hydrogen. In this context, the blocking of hydrogen diffusion is not desirable.

U.S. Pat. No. 5,500,553 to Ikegami teaches forming a metal cap over polysilicon resistors to equalize the change in resistance caused by hydrogen atoms diffusing into the polysilicon. U.S. Pat. No. 5,530,418 to Hsu et al discloses a three-dimensional structure to protect a resistor from hydrogen diffusion. Dummy polysilicon structures absorb the hydrogen. U.S. Pat. No. 5,656,524 to Eklund et al discloses a nitride/oxide stack partially covering the polysilicon resistor.

U.S. Pat. No. 5,728,615 to Cheng et al states that a conventional solution to the absorption of hydrogen by a polysilicon resistor is to cap the resistor with a nitride layer. This conventional nitride cap is formed by plasma-enhanced chemical vapor deposition (PECVD). PECVD silicon nitride has a lower density and a high induced hydrogen concentration than silicon nitride deposited by low pressure chemical vapor deposition (LPCVD). Cheng et al teach a thermal treatment in $N_2$ with a $H_2$ ambient to equalize the hydrogen concentration in a polysilicon resistor. U.S. Pat. Nos. 5,236,857 and 5,465,005 to Eklund et al teach forming an oxide or nitride layer over a polysilicon resistor as an insulator. In this process, the oxide or nitride layer is formed over the polysilicon layer and patterned before the polysilicon layer is patterned. The problem of penetrating hydrogen atoms is not addressed by these patents.

SUMMARY OF THE INVENTION

Accordingly, it is a principal object of the present invention to provide an effective and very manufacturable method of fabricating a high-value polysilicon resistor in the manufacture of integrated circuits.

A further object of the invention is to provide a method for forming a polysilicon resistor having reduced resistance variations.

A still further object is to provide a method for forming a polysilicon resistor having reduced resistance variations by using an LPCVD silicon nitride cap over the polysilicon resistor.

Another object of the invention is to block the diffusion of hydrogen atoms into a polysilicon resistor by means of an LPCVD silicon nitride barrier layer.

In accordance with the objects of this invention a new method of forming a polysilicon resistor having reduced resistance variations by using an LPCVD silicon nitride cap over the polysilicon resistor is achieved. A field oxide layer is provided overlying a semiconductor substrate. A polysilicon layer is deposited overlying the field oxide layer and etched away where it is not covered by a mask to form a polysilicon resistor. The polysilicon resistor is oxidized to form an oxide layer on all surfaces of the polysilicon resistor. A silicon nitride barrier layer is deposited overlying the oxide layer. An interlevel dielectric layer is deposited overlying the silicon nitride barrier layer. Contact openings are etched through the interlevel dielectric layer, silicon nitride barrier layer, and oxide layer to the polysilicon resistor. The contact openings are filled with a metal layer which is patterned. The patterned metal layer is covered with a passivation layer wherein the passivation layer contains hydrogen atoms and wherein the silicon nitride barrier layer prevents the hydrogen atoms from penetrating the polysilicon resistor.

BRIEF DESCRIPTION OF THE DRAWINGS

In the accompanying drawings forming a material part of this description, there is shown.

DESCRIPTION OF THE PREFERRED EMBODIMENTS

Figure 1:
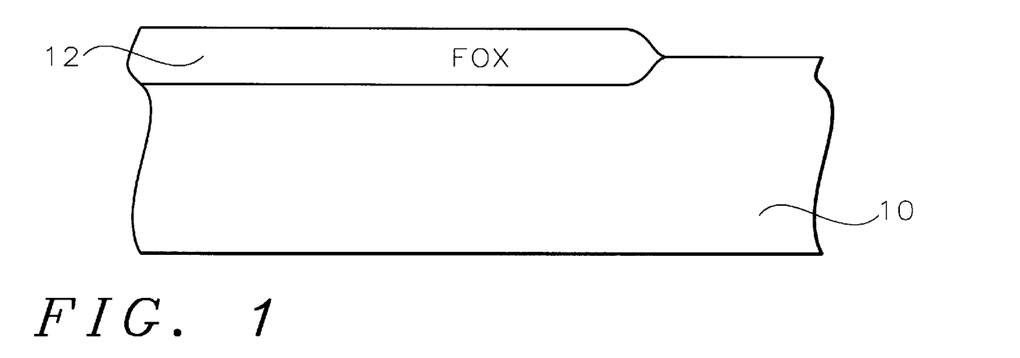
FIGS. 1 through 11 and 15 schematically illustrate in cross-sectional representation a preferred embodiment of the present invention.
Figure 2:
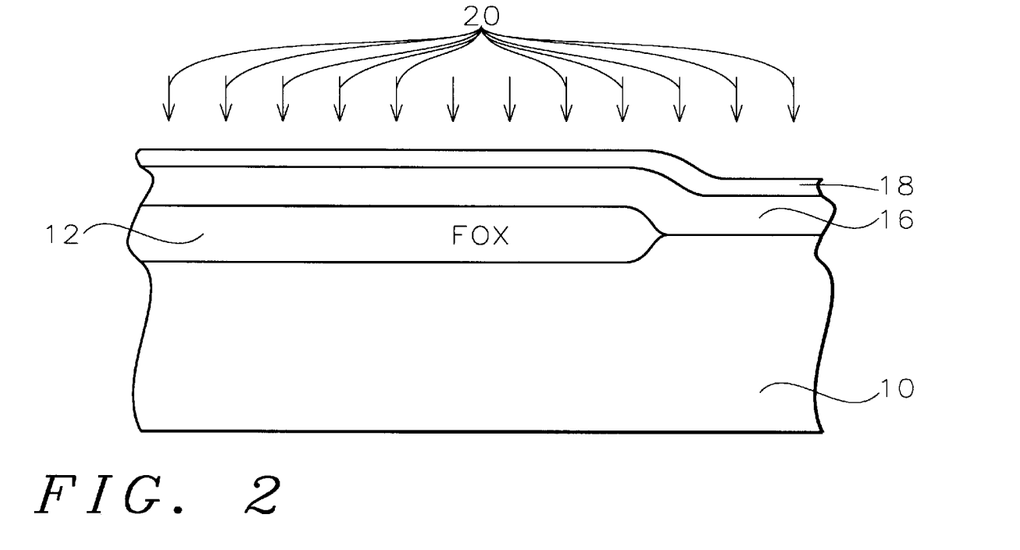

Referring now more particularly to FIG. 1, there is illustrated a portion of a partially completed integrated circuit. There is shown a semiconductor substrate 10, preferably composed of monocrystalline silicon. A field oxide layer 12 is formed over the semiconductor substrate, as is conventional in the art, to a thickness of between about 6000 and 7500 Angstroms. Referring to FIG. 2, a layer of polysilicon 16 is deposited over the field oxide layer 12 to a thickness of between about 3500 and 4400 Angstroms. The polysilicon layer is oxidized to form a silicon dioxide layer 18 over the polysilicon layer having a thickness of between about 150 and 250 Angstroms. This oxidation serves two purposes. First, this pre-anneals the polysilicon layer to stabilize resistance. Second, the silicon dioxide layer 18 protects the polysilicon surface from the subsequent ion implantation process.

An ion implantation 20 is performed through the silicon dioxide layer 18 into the polysilicon layer 16 to form the high-value polysilicon resistor. For example, P31 ions are implanted into the polysilicon layer at a dosage of between about 5 E 14 and 4 E 15 atoms/cm$^2$ at an energy of between about 30 and 50 KeV. Alternatively, the polysilicon may be in-situ doped.

Figure 3:
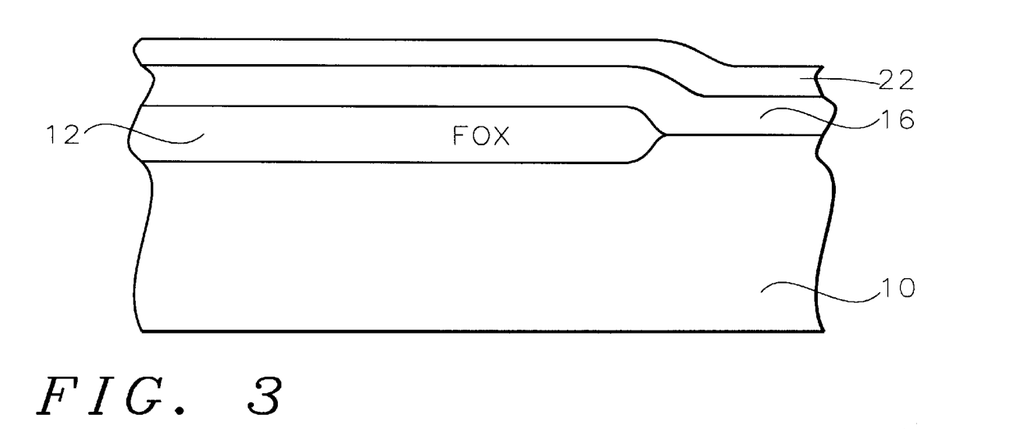

Next, referring to FIG. 3, a silicon dioxide capping layer 22 is deposited over the first silicon dioxide layer 18. This combined layer will now be referred to as layer 22. The combined silicon dioxide layer has a thickness of between about 2000 and 3000 Angstroms.

Figure 4:
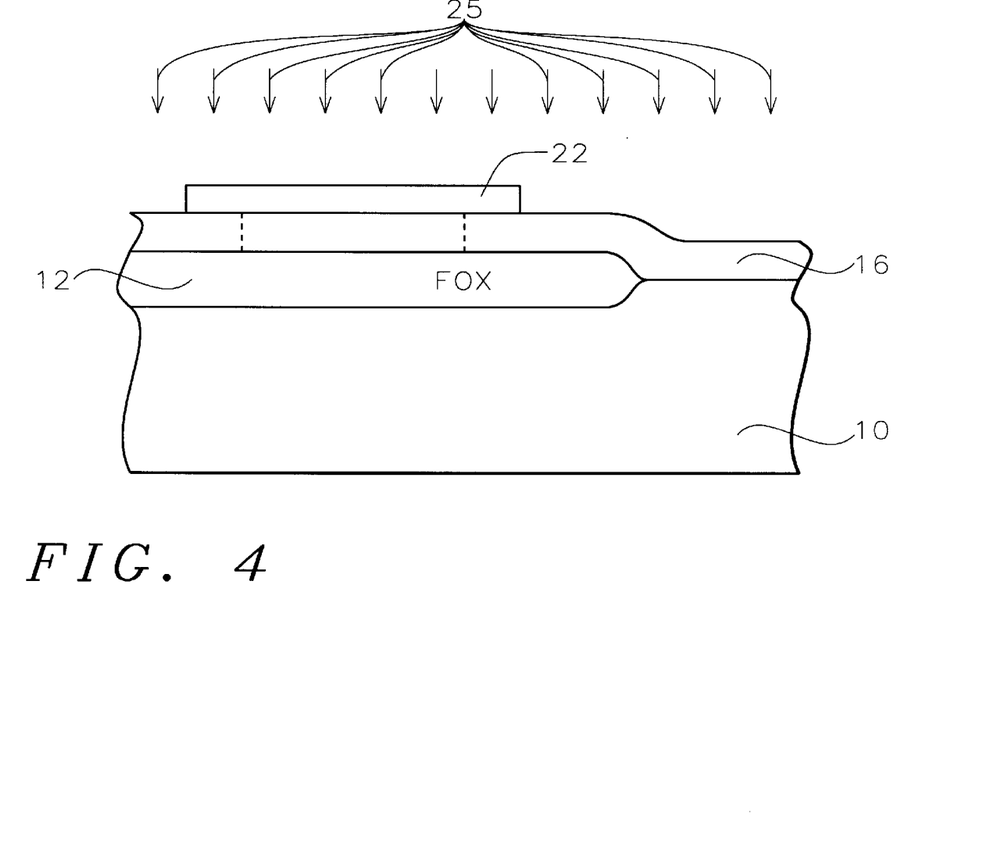

A photoresist mask, not shown, is formed over the surface of the capping silicon dioxide layer 22. The silicon dioxide layer is etched away where it is not covered by the photoresist mask, as shown in FIG. 4. The capping dioxide layer remains over the area where the resistor is to be formed, indicated by the dotted line in FIG. 4.

The wafer is heated to a temperature of between about 850 and 950° C. POCl$_3$ ions 25 are diffused by this heating into the polysilicon layer 16 to dope the gate polysilicon. The capping silicon dioxide layer 22 protects the future resistor from the gate doping. The doped gate polysilicon 16 will have a sheet resistance of between about 25 and 30 ohms per square.

Figure 5:
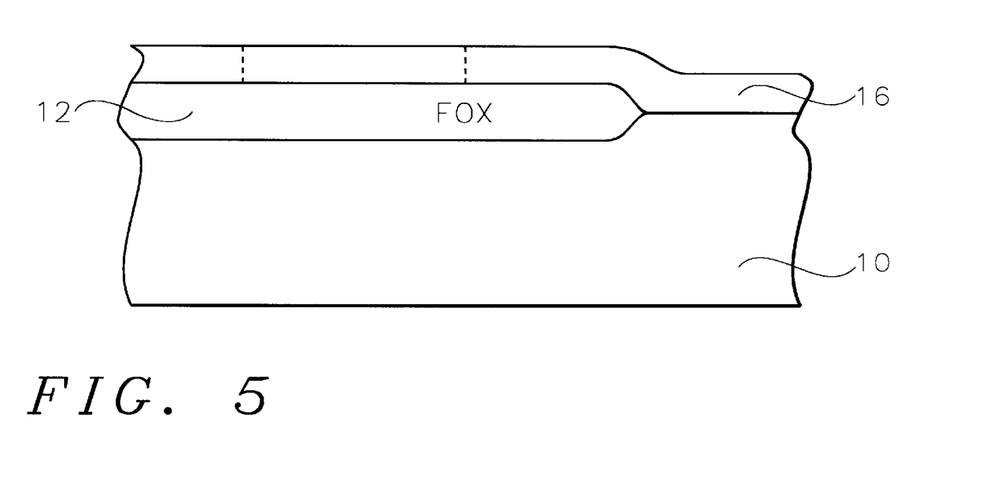

The capping silicon dioxide layer 22 is removed, as shown in FIG. 5.

Figure 6:
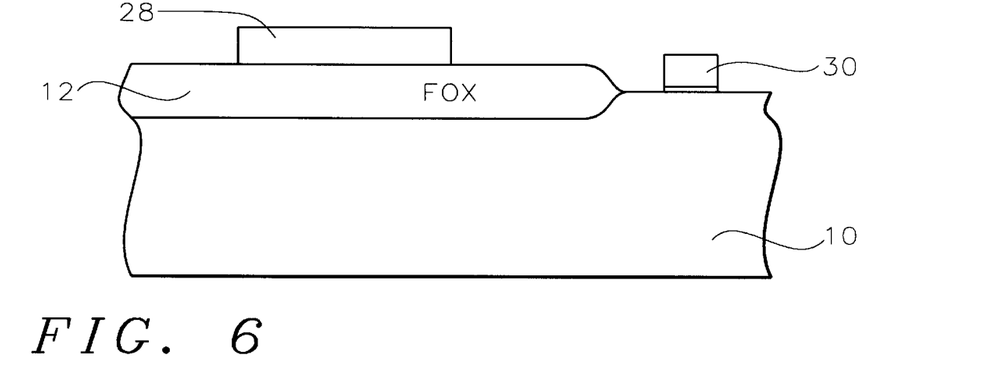

Referring now to FIG. 6, a second photoresist mask, not shown, is formed over the polysilicon layer. The polysilicon layer is etched away where it is exposed by the photoresist mask to form polysilicon resistors, such as 28, and polysilicon gate electrodes, such as 30. Polysilicon resistor 28 will have a sheet resistance of between about 300 and 2000 ohms per square.

Figure 7:
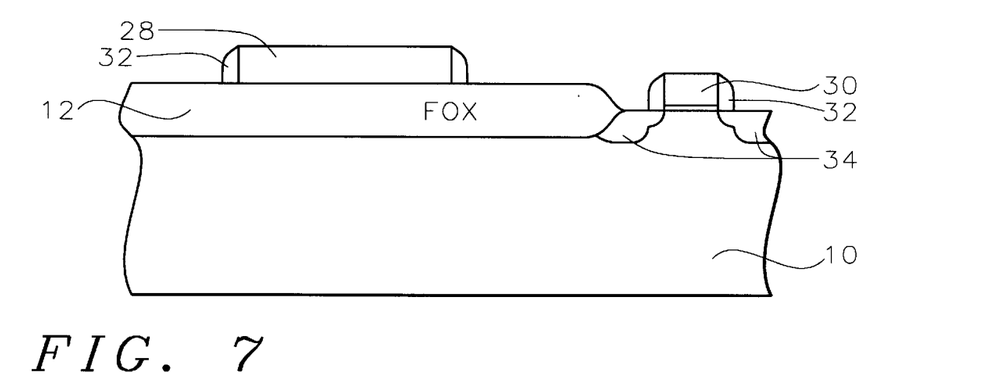

Now, in the device regions, optionally spacers 32 are formed on the sidewalls of the gate electrode 30 and resistor 28, if desired, and associated source/drain regions 34 are formed within the semiconductor substrate, as shown in FIG. 7.

Figure 8:
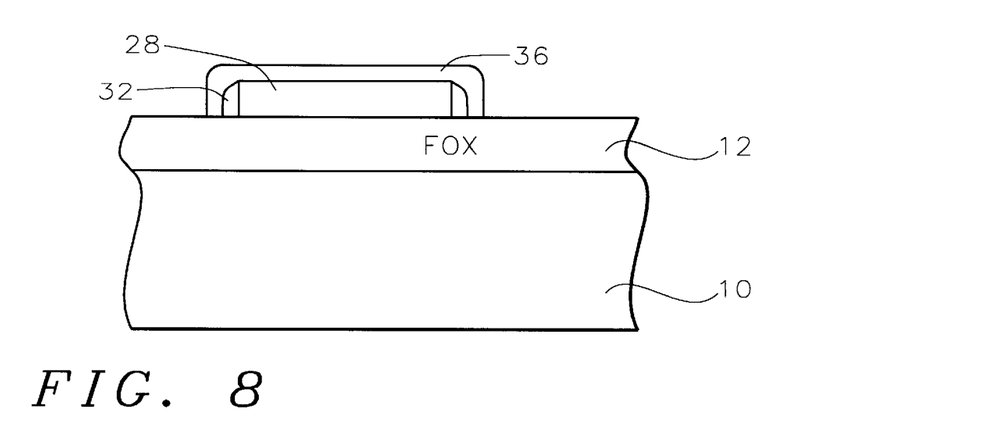

The remaining figures will illustrate only the resistor 28 portion of the integrated circuit device. Referring now to FIG. 8, the polysilicon surface is oxidized to form oxide layer 36 on all exposed surfaces of the polysilicon resistor 28. The oxide layer is very thin with a thickness of between about 150 and 300 Angstroms. This oxide layer 36 will provide stress relief for the subsequently deposited silicon nitride layer.

Figure 9:
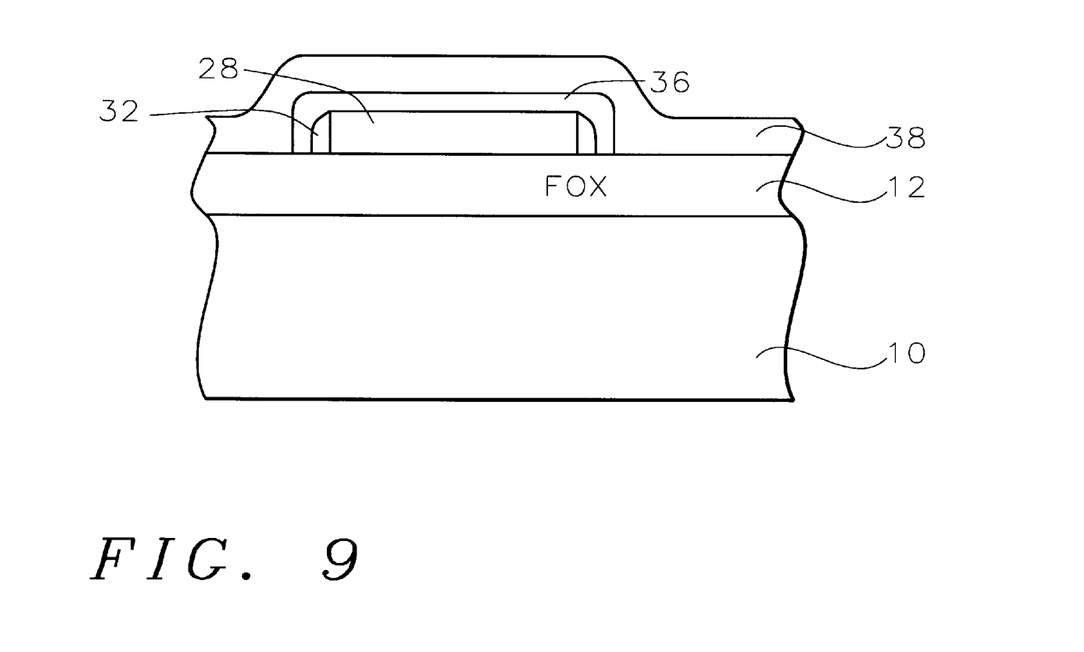

Next, as illustrated in FIG. 9, a silicon nitride layer 38 is deposited by low pressure chemical vapor deposition (LPCVD) to a thickness of between about 300 and 1000 Angstroms. The silicon nitride layer is deposited by LPCVD using silane and ammonia at a temperature of between about 730 and 830∪ C. Fewer hydrogen atoms are present than would be in a PECVD deposition because of the reduced pressure technique. The LPCVD silicon nitride layer 38 has a high density of between about 2.9 to 3.1 grams/cm$^3$. PECVD silicon nitride has a lower density of about 2.4 to 2.8 grams/cm$^3$. Also, the induced hydrogen concentration of the LPCVD silicon nitride layer 38 is about 4 to 8% as compared to 20 to 25% for PECVD silicon nitride.

Figure 10:
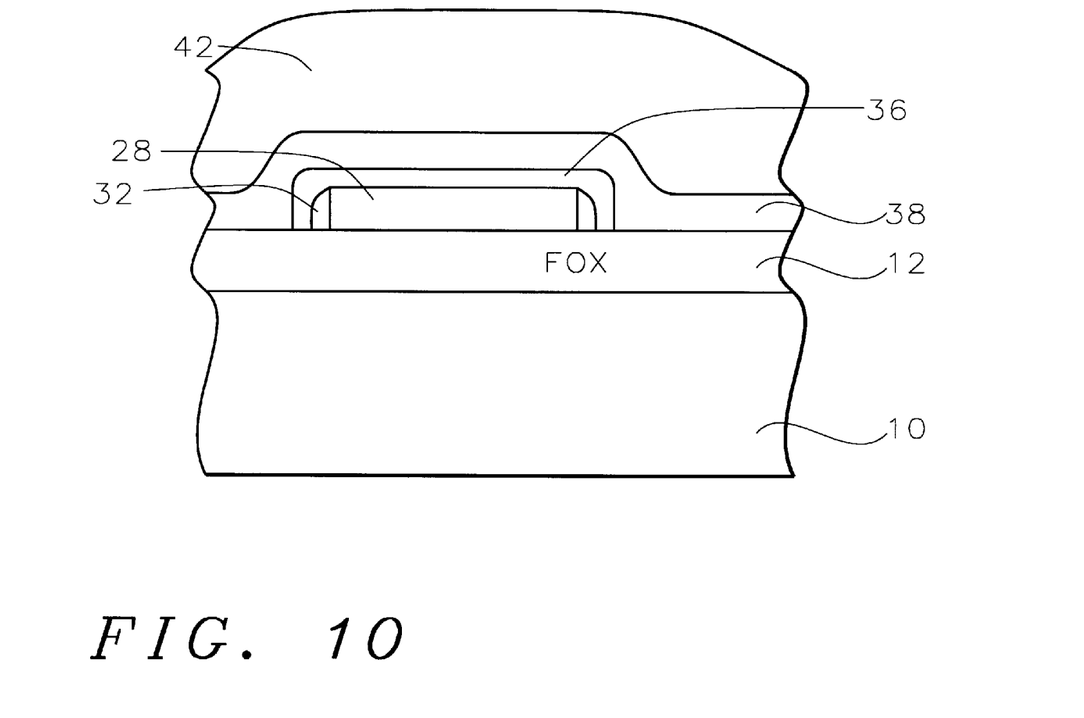

Referring now to FIG. 10, an interlevel dielectric layer 42 is deposited over the surface of the substrate. This may be a layer of borophosphosilicate glass (BPSG) or phosphosilicate glass (PSG), or the like, deposited to a thickness of between about 7500 and 8700 Angstroms.

Figure 11:
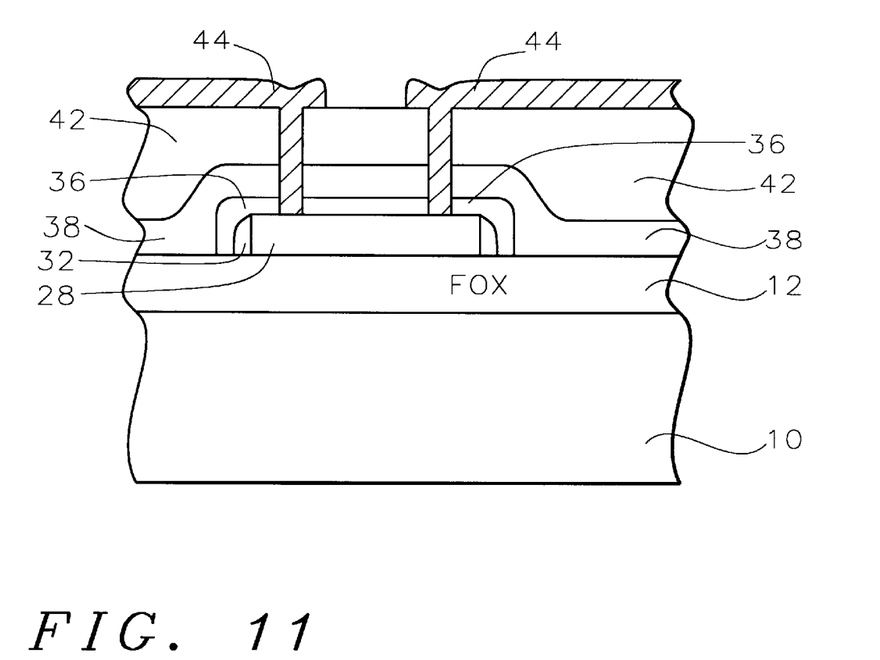
Figure 12:
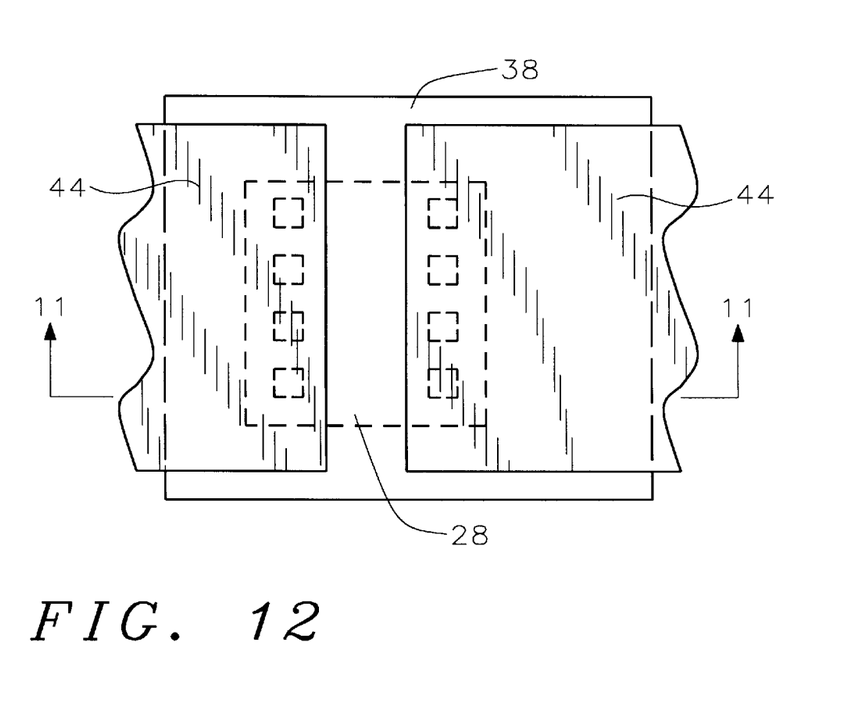
FIG. 12 schematically illustrates in top view view 11—11 of the present invention.

Contact openings are etched through the dielectric layers 42, 38, and 36 to the polysilicon resistor 28. A metal layer is deposited within the contact openings and patterned to form the metal contacts 44, as shown in FIG. 11. FIG. 12 illustrates a top view of the polysilicon resistor 28. FIG. 11 shows view 11—11 of FIG. 12. It can be seen in FIG. 12 that the LPCVD silicon nitride cap 38 completely covers the polysilicon resistor 28. Metal contacts 44 are shown.

Figure 13:
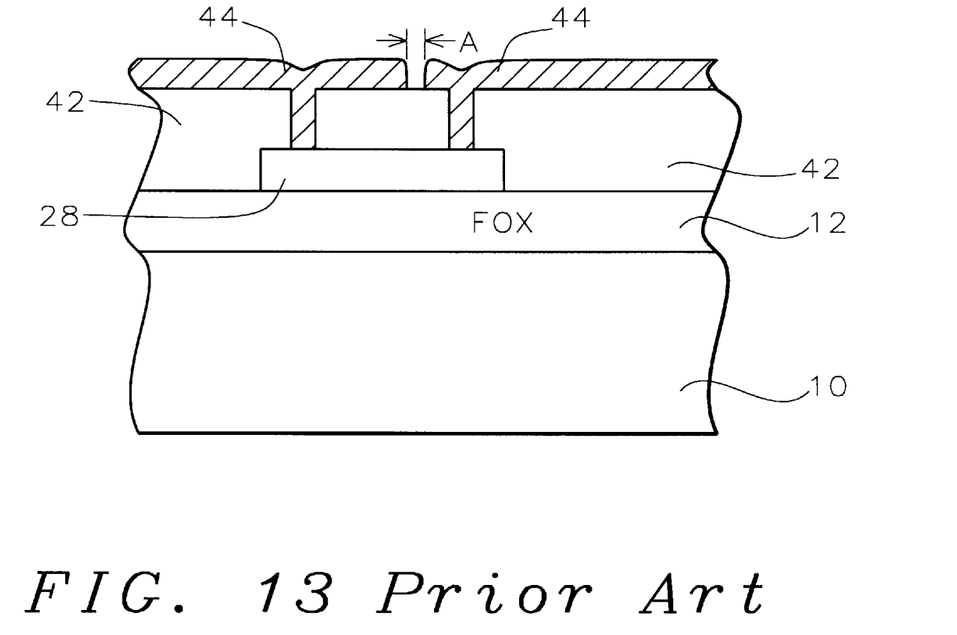
FIG. 13 schematically illustrates in cross-sectional representation a metal capping scheme of the prior art.
Figure 14:
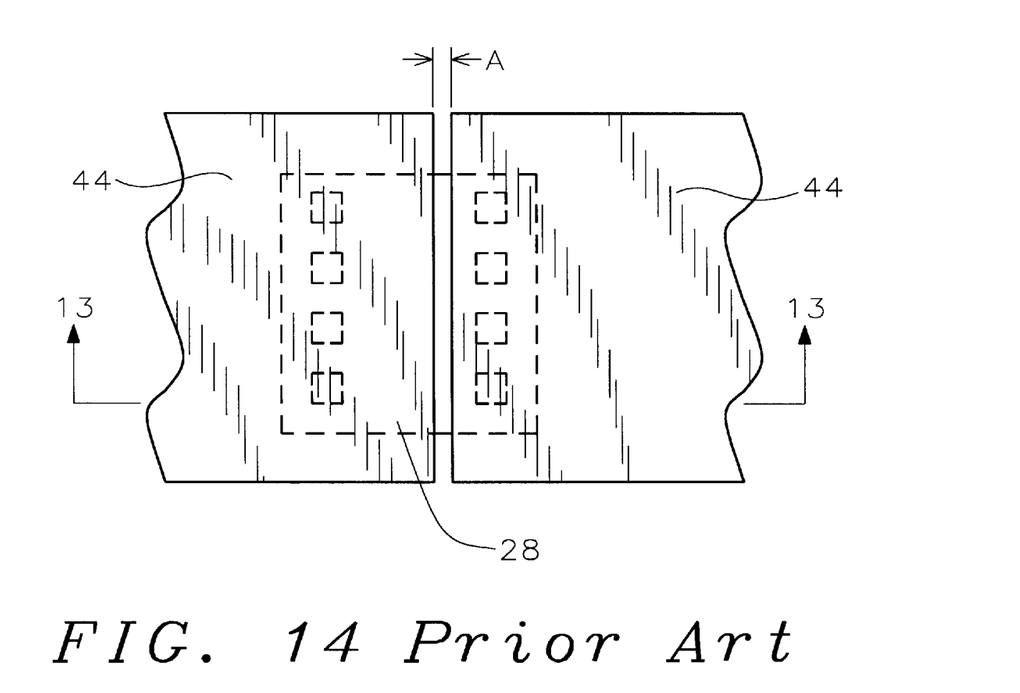
FIG. 14 schematically illustrates in top view view 13—13 of the prior art.

FIGS. 13 and 14 illustrate a case in which a metal cap rather than the LPCVD silicon nitride cap of the present invention is used to prevent hydrogen diffusion into the polysilicon resistor. FIG. 13 shows view 13—13 of the top view shown in FIG. 14. Polysilicon resistor 28 is illustrated, covered by interlevel dielectric layer 42. Metal layer 46 fills the contact openings through the dielectric layer 42 to the resistor 28 and also provides a capping layer over the resistor. However, since the resistor covers a large area, 100% shielding cannot be achieved. The layout rule for the single metal process requires a metal-to-metal spacing A. Hydrogen atoms can penetrate in this area. If the metal cap is to be effective, the resistor area must become a restricted region for the single metal interconnection layout.

The LPCVD silicon nitride capping layer of the present invention does not suffer from the spacing problem of the metal capping layer. With the process of the invention, the metal definition has no restriction.

Figure 15:
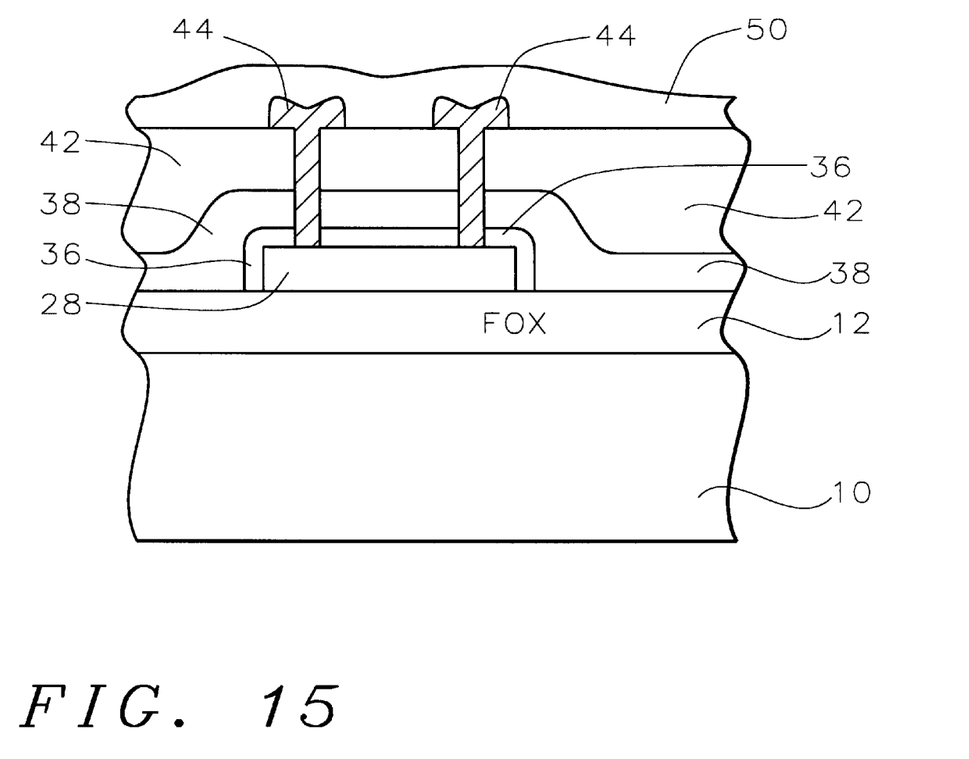

Returning now to FIG. 11, processing continues to provide a passivation layer 50 overlying the patterned metal layer 44. Typically, the passivation layer is a combination of a PSG layer having a thickness of 4000 to 5000 Angstroms and a PECVD silicon nitride layer deposited to a thickness of between about 6000 and 7000 Angstroms over the surface of the substrate, as illustrated in FIG. 15. The capping LPCVD silicon nitride layer 38 provides 100% shielding to prevent hydrogen atoms from the PECVD silicon nitride passivation, or other sources, from penetrating into the polysilicon resistor 28, resulting in more precise resistance control of high-value polysilicon resistors. PECVD silicon nitride must be used as the passivation layer rather than LPCVD silicon nitride because the high temperature required for LPCVD cannot be used after metallization.

The process of the present invention provides a simple and effective method of achieving precise resistance control of high-value polysilicon resistors. The process of the invention can be used in mixed-mode and analog technologies, or any other application which requires high-value polysilicon resistors. The resistance fluctuation and mis-matching problems can be improved effectively by the 100% shielding provided by the capping LPCVD silicon nitride layer over the resistor.

While the invention has been particularly shown and described with reference to the preferred embodiments thereof, it will be understood by those skilled in the art that various changes in form and details may be made without departing from the spirit and scope of the invention.

What is claimed is:

1. A method of forming a polysilicon resistor in the fabrication of integrated circuits comprising:

providing a field oxide layer overlying a semiconductor substrate;

depositing a polysilicon layer overlying said field oxide layer;

etching away said polysilicon layer where it is not covered by a mask to form a polysilicon resistor;

oxidizing said polysilicon resistor to form an oxide layer on all surfaces of said polysilicon resistor;

depositing a silicon nitride barrier layer overlying said oxide layer;

depositing an interlevel dielectric layer overlying said silicon nitride barrier layer;

etching contact openings through said interlevel dielectric layer, said silicon nitride barrier layer, and said oxide layer to said polysilicon resistor;

filling said contact openings with a metal layer and patterning said metal layer; and covering said patterned metal layer with a passivation layer wherein said passivation layer contains hydrogen atoms and wherein said silicon nitride barrier layer prevents said hydrogen atoms from penetrating said polysilicon resistor.

2. The method according to claim 1 wherein said polysilicon layer has a thickness of between about 3500 and 4400 Angstroms.

3. The method according to claim 1 after said step of depositing said polysilicon layer further comprising:

oxidizing said polysilicon layer to form a first oxide layer overlying said polysilicon layer;

implanting first ions through said first oxide layer into said polysilicon layer to dope said polysilicon layer;

thereafter depositing a capping oxide layer overlying said first oxide layer and patterning said capping oxide layer and said first oxide layer to cover planned said polysilicon resistor;

diffusing second ions into said polysilicon layer to provide gate doping wherein said capping oxide layer over planned said polysilicon resistor prevents said second ions from penetrating planned said polysilicon resistor; and thereafter removing said capping oxide layer and said first oxide layer.

4. The method according to claim 1 wherein said oxide layer has a thickness of between about 150 and 300 Angstroms.

5. The method according to claim 1 wherein said silicon nitride barrier layer is deposited by low pressure chemical vapor deposition to a thickness of between about 300 and 1000 Angstroms.

6. The method according to claim 1 wherein said interlevel dielectric layer comprises borophosphosilicate glass (BPSG) having a thickness of between about 7500 and 8700 Angstroms.

7. The method according to claim 1 wherein said passivation layer comprises phosphosilicate glass and silicon nitride deposited by plasma-enhanced chemical vapor deposition.

8. A method of forming a polysilicon resistor in the fabrication of integrated circuits comprising:

providing a field oxide layer overlying a semiconductor substrate;

depositing a polysilicon layer overlying said field oxide layer;

oxidizing said polysilicon layer to form a first oxide layer overlying said polysilicon layer;

implanting first ions through said first oxide layer into said polysilicon layer to dope said polysilicon layer;

depositing a capping oxide layer overlying said first oxide layer and patterning said capping oxide layer and said first oxide layer to cover planned said polysilicon resistor;

diffusing second ions into said polysilicon layer to provide gate doping wherein said capping oxide layer over planned said polysilicon resistor prevents said second ions from penetrating planned said polysilicon resistor;

thereafter removing said capping oxide layer and said first oxide layer;

etching away said polysilicon layer where it is not covered by a mask to form a polysilicon resistor;

oxidizing said polysilicon resistor to form a second oxide layer on all surfaces of said polysilicon resistor;

depositing a silicon nitride barrier layer by low pressure chemical vapor deposition overlying said second oxide layer;

depositing an interlevel dielectric layer overlying said silicon nitride barrier layer;

etching contact openings through said interlevel dielectric layer, said silicon nitride barrier layer, and said oxide layer to said polysilicon resistor;

filling said contact openings with a metal layer and patterning said metal layer; and covering said patterned metal layer with a passivation layer wherein said passivation layer contains hydrogen atoms and wherein said silicon nitride barrier layer prevents said hydrogen atoms from penetrating said polysilicon resistor.

9. The method according to claim 8 wherein said polysilicon layer has a thickness of between about 3500 and 4400 Angstroms.

10. The method according to claim 8 wherein said first oxide layer has a thickness of between about 150 and 250 Angstroms.

11. The method according to claim 8 wherein said capping oxide layer has a thickness of between about 2000 and 3000 Angstroms.

12. The method according to claim 8 wherein said second oxide layer has a thickness of between about 150 and 300 Angstroms.

13. The method according to claim 8 wherein said silicon nitride barrier layer has a thickness of between about 300 and 1000 Angstroms.

14. The method according to claim 8 wherein said interlevel dielectric layer comprises borophosphosilicate glass (BPSG) having a thickness of between about 7500 and 8700 Angstroms.

15. The method according to claim 8 wherein said passivation layer comprises phosphosilicate glass and silicon nitride deposited by plasma-enhanced chemical vapor deposition.

16. A method of forming a polysilicon resistor in the fabrication of integrated circuits comprising:

providing a field oxide layer overlying a semiconductor substrate;

depositing a polysilicon layer overlying said field oxide layer;

oxidizing said polysilicon layer to form a first oxide layer overlying said polysilicon layer;

implanting first ions through said first oxide layer into said polysilicon layer to dope said polysilicon layer;

depositing a capping oxide layer overlying said first oxide layer and patterning said capping oxide layer and said first oxide layer to cover planned said polysilicon resistor;

diffusing second ions into said polysilicon layer to provide gate doping wherein said capping oxide layer over planned said polysilicon resistor prevents said second ions from penetrating planned said polysilicon resistor;

thereafter removing said capping oxide layer and said first oxide layer;

etching away said polysilicon layer where it is not covered by a mask to form a polysilicon resistor;

oxidizing said polysilicon resistor to form a second oxide layer on all surfaces of said polysilicon resistor;

depositing a silicon nitride barrier layer by low pressure chemical vapor deposition overlying said second oxide layer to a thickness of between 300 and 1000 Angstroms;

depositing an interlevel dielectric layer overlying said silicon nitride barrier layer;

etching contact openings through said interlevel dielectric layer, said silicon nitride barrier layer, and said oxide layer to said polysilicon resistor;

filling said contact openings with a metal layer and patterning said metal layer; and covering said patterned metal layer with a passivation layer wherein said passivation layer contains hydrogen atoms and wherein said silicon nitride barrier layer prevents said hydrogen atoms from penetrating said polysilicon resistor.

17. The method according to claim 16 wherein said polysilicon layer has a thickness of between about 3500 and 4400 Angstroms.

18. The method according to claim 16 wherein said capping oxide layer has a thickness of between about 2000 and 3000 Angstroms.

19. The method according to claim 16 wherein said second oxide layer has a thickness of between about 150 and 300 Angstroms.

20. The method according to claim 16 wherein said passivation layer comprises phosphosilicate glass and silicon nitride deposited by plasma-enhanced chemical vapor deposition.

* * * * *